United States Patent
Hofmann et al.

(10) Patent No.: US 9,541,960 B2
(45) Date of Patent: Jan. 10, 2017

(54) DEVICE ARRANGEMENT

(71) Applicant: ECOM Instruments GmbH, Assamstadt (DE)

(72) Inventors: Dieter Hofmann, Lauda-Koenigshofen (DE); Dieter Roessler, Forchtenberg-Ernsbach (DE)

(73) Assignee: ECOM INSTRUMENTS GMBH (DE)

( * ) Notice: Subject to any disclaimer, the term of this patent is extended or adjusted under 35 U.S.C. 154(b) by 0 days.

(21) Appl. No.: 14/662,221

(22) Filed: Mar. 18, 2015

(65) Prior Publication Data

US 2015/0268698 A1    Sep. 24, 2015

(30) Foreign Application Priority Data

Mar. 19, 2014   (DE) .................. 10 2014 205 137

(51) Int. Cl.

| | |
|---|---|
| *H04M 1/00* | (2006.01) |
| *G06F 1/16* | (2006.01) |
| *G06F 1/18* | (2006.01) |
| *H05K 5/00* | (2006.01) |
| *H05K 5/02* | (2006.01) |
| *H04M 1/02* | (2006.01) |
| *H04M 1/18* | (2006.01) |

(52) U.S. Cl.
CPC ........... *G06F 1/1656* (2013.01); *G06F 1/1626* (2013.01); *G06F 1/182* (2013.01); *H04M 1/0266* (2013.01); *H04M 1/185* (2013.01); *H05K 5/0004* (2013.01); *H05K 5/0217* (2013.01); *G06F 2200/1633* (2013.01)

(58) Field of Classification Search
CPC ...... G06F 1/1656; G06F 1/1626; G06F 1/182; G06F 2200/1633; H05K 5/0004; H05K 5/0217; H04M 1/0266; H04M 1/185

USPC ................. 455/575.8, 575.1, 550.1
See application file for complete search history.

(56) References Cited

U.S. PATENT DOCUMENTS

| | | | | |
|---|---|---|---|---|
| 8,503,170 | B1 * | 8/2013 | Hsu ................. | G06F 1/1626 206/320 |
| 8,800,764 | B2 * | 8/2014 | Wu .................. | A45C 11/00 206/320 |
| 9,204,697 | B2 * | 12/2015 | Yang ................. | A45C 11/00 |
| 2006/0279924 | A1 * | 12/2006 | Richardson ........... | G06F 1/1613 361/679.09 |

(Continued)

FOREIGN PATENT DOCUMENTS

| | | |
|---|---|---|
| DE | 102011088495 A1 | 6/2013 |
| DE | 102012222017 A1 | 6/2014 |

(Continued)

OTHER PUBLICATIONS

Search Report for EP Application No. 15157606.3, dated Jul. 28, 2015, 3 pp.

(Continued)

*Primary Examiner* — Khai M Nguyen
(74) *Attorney, Agent, or Firm* — Fishman Stewart PLLC

(57) ABSTRACT

A device arrangement may include a casing surrounding a casing interior. The casing may include a viewing window which is sealed by a transparent window pane. An electronic device may be disposed in the casing interior and have a display. The display may be secured in a fixed position on the window pane. A suspension/damping device may support at least one of the window pane and the electronic device on the casing.

20 Claims, 1 Drawing Sheet

(56) References Cited

U.S. PATENT DOCUMENTS

| | | | |
|---|---|---|---|
| 2009/0080153 A1 | 3/2009 | Richardson et al. | |
| 2013/0220841 A1* | 8/2013 | Yang | A45C 11/00 206/37 |
| 2015/0028730 A1 | 1/2015 | Loeffel et al. | |
| 2015/0274394 A1* | 10/2015 | Hofmann | B65D 81/022 220/560.01 |

FOREIGN PATENT DOCUMENTS

| | | |
|---|---|---|
| WO | WO-2005/062087 A1 | 7/2005 |
| WO | WO-2013/106474 A1 | 7/2013 |
| WO | WO-2013/181644 A1 | 12/2013 |

OTHER PUBLICATIONS

English abstract provided for DE-102012222017.
German Search Report for DE-102014205137.1, mailed Dec. 9, 2014.

\* cited by examiner

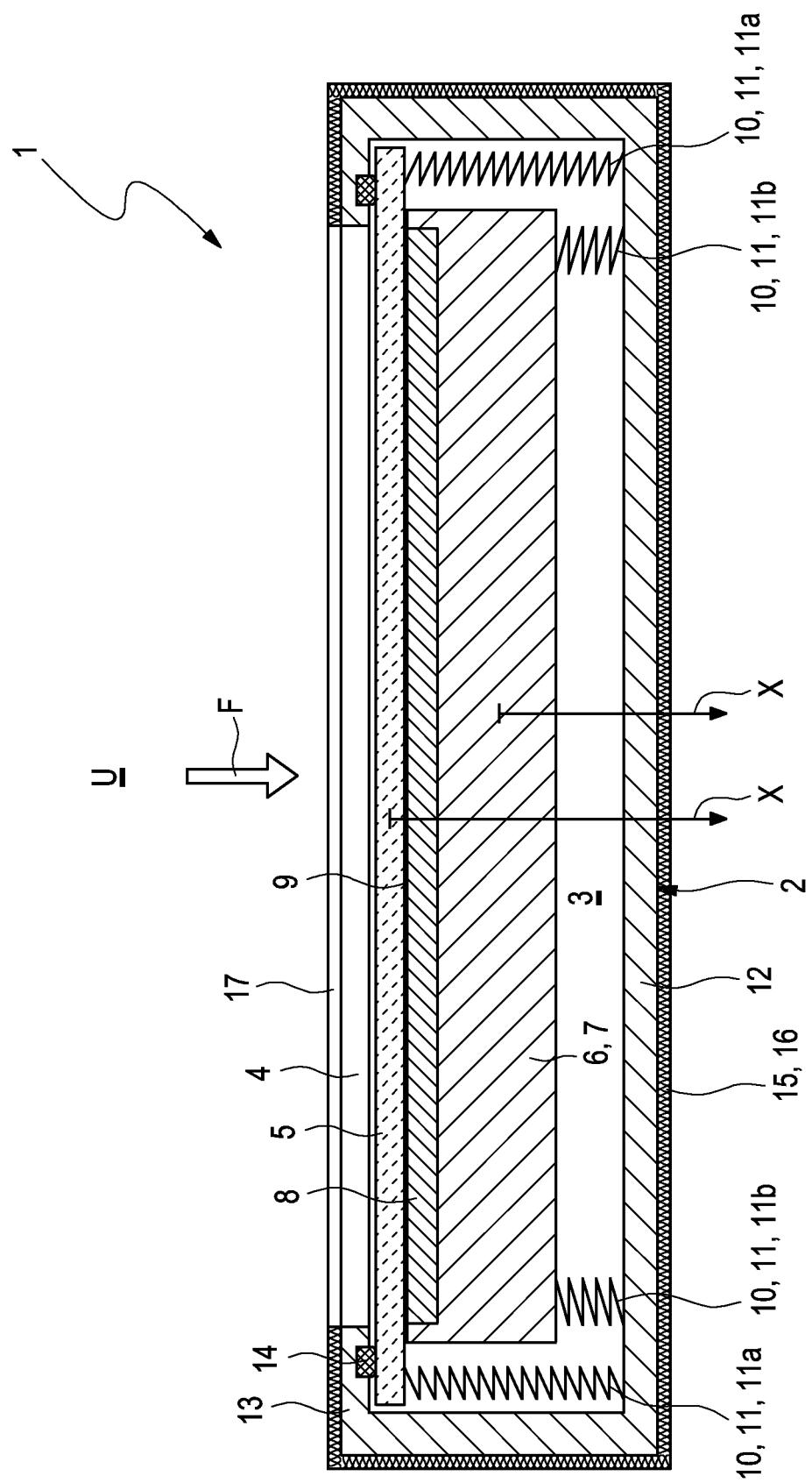

DEVICE ARRANGEMENT

CROSS-REFERENCE TO RELATED APPLICATIONS

This application claims priority to German Patent Application No. 10 2014 205 137.1, filed Mar. 19, 2014, the contents of which are hereby incorporated by reference in their entirety.

TECHNICAL FIELD

The invention relates to a device arrangement.

BACKGROUND

Modern computers are being increasingly manufactured in the form of so-called tablet Computers—also known in a simplified manner in technical circles as "tablets". Such a tablet comprises a portable computer with flat geometry which has a touch-sensitive display configured in the form of a touchscreen, i.e. the display of the tablet is used at the same time as an input unit, with the result that the provision of a keypad or a mouse is superfluous. The latest generation of tablets resembles the modern smartphone in terms of their specification.

As a result of their simple handling, tablet computers are also being increasingly used in explosion-prone areas such as, for example, oil drilling platforms or similar, as a working device. For any casing in which electronic devices are mounted which are intended for use in such explosion-prone areas, inter alia requirements for their mechanical strength defined in the DIN standard EN 60079-0 apply. In this way, it should be prevented that the casing can be damaged by externally acting mechanical impact forces and that the device accommodated in the casing can be exposed and can come in contact with the surroundings.

SUMMARY

It is therefore the object of the present invention to provide an improved embodiment of a device arrangement comprising an electronic device, in particular a tablet computer, which is particularly suitable for use in said explosion-prone areas.

This object is solved by a device arrangement according to the independent claims. Preferred embodiments are the subject matter of the dependent patent claims.

The basic idea of the invention is accordingly to fix the electronic device inside in a fixed position on a window pane provided in the casing and to mount the window pane and, alternatively or additionally, the electronic device itself on the casing by means of a suspension/damping device. The term "suspension/damping device" for mounting the inner casing on the outer casing in the present context is intended to cover any elements which have resilient properties and, alternatively or additionally, also damping properties.

For the case where the window pane experiences an impact or blow from outside, the energy transmitted to the window pane in this case is at least partially absorbed by the suspension/damping device, for which the window pane including the electronic device fastened thereon is temporally deflected from its rest position. In this way, the mechanical loading of the window pane caused by the impact or blow is reduced considerably. This results in a significantly improved fracture resistance of the device arrangement in connection with impacts or blows acting on the window pane or on the display so that the electronic device as part of the device arrangement according to the invention presented here meets the legal minimum requirements required for use in explosion-prone areas. The device arrangement presented here is therefore suitable for operation of an electronic device in an explosion-prone area.

A device arrangement according to the invention comprises a casing surrounding a casing interior, which has a viewing window which in turn is sealed by a transparent window pane. Located in the casing interior is an electronic device fitted with a display, in particular a tablet computer, which is fastened to the window pane in a fixed position. The device arrangement further comprises the suspension/damping device which has already been explained, by means of which the window pane and/or the electronic device can be supported on the casing.

In a preferred embodiment, the casing has a casing wall bordering the viewing window, against which the window pane and/or the electronic device is pre-tensioned by means of the suspension/damping device. This means that the window pane or the electronic device is pressed from inside against said casing wall and consequently abuts against this in a mechanically stable manner as long as no external impact forces act on the window pane. In a variation, the suspension/damping device may be generally pretensioned against the casing.

Preferably the window pane is mounted flexibly at the casing by means of the suspension/damping device, in particular at the casing wall bordering the viewing window. Thus, the window pane may temporarily become detached from the casing in case of a blow or impact onto the casing before being pressed against anew the casing by means of the suspension/damping device. Thus, a bursting of the window pane caused by blow or impact may be prevented.

An especially break resistance of the window pane is achieved, if it fits closely to the casing, in particular the casing wall, without forming a firmly bonded connection and without forming a adhesive joint with the casing.

The suspension/damping device presented here, which is essential to the invention, can be implemented constructively particularly simply by providing at least one suspension/damping element made of a resilient material. In more complex constructive embodiments naturally a plurality of such damping/spring elements can also be provided, which can be attached locally at various suitable positions in the casing of the device arrangement. A plurality of different constructive embodiments presents itself to the relevant person skilled in the art here, among which he may select from application-specific aspects.

However, an embodiment in which the at least one suspension/damping element is made of an elastomer, in particular of a foam, may be deemed to be particularly advantageous from the production technology point of view, since it is inexpensive to manufacture.

In a further preferred embodiment, at least one first suspension/damping element is provided in the casing interior by means of which the window pane can be supported resiliently on the casing. Alternatively or additionally according to this embodiment, at least a second suspension/damping element can also be provided in the casing, by means of which the electronic device can also be supported resiliently on the casing.

The fracture strength of the casing of the device arrangement can be improved not inconsiderably by providing an additional suspension/damping device outside on the casing. Such a suspension/damping device may possibly be implemented in the form of a jacket having resilient properties which has a through-opening in the area of the window pane to give the user of the electronic device a view of its display. In this scenario, a plurality of possibilities for implementation also presents itself to the person skilled in the art; it can possibly be considered to provide such a jacket only in a web-like manner in the area of the casing edges or corners. In a further variant the additional suspension/damping device can comprise one or a plurality of suspension/damping elements which are only fastened locally on a casing outer side of the casing, for example, on a rear pane of the casing facing away from the window pane.

An elastomer, for example, a styrene block copolymer (SEBS) or an ethylene propylene diene rubber (EPDM) can also be considered as material for the additional suspension/damping device.

According to a further preferred embodiment it is proposed to provide a sealing element between casing wall and window pane, which sealing element seals the casing interior of the casing against the surroundings. In this way, it can be prevented that any explosive gas mixture present in the surroundings of the device arrangement could penetrate into the casing interior when the movably mounted window pane is deflected from its rest position in which it seals the viewing window in the event of an externally acting impact force.

Particularly expediently, the sealing element can be configured in the manner of a sealing ring which circumferentially borders the viewing window. For this purpose a sealing groove configured complementarily to the sealing ring can optionally be provided in the casing wall, in which the sealing ring can be at least partially received.

A particularly high fracture resistance of the device arrangement and therefore a particularly good protection of the electronic device accommodated in the casing can however be achieved whereby the window pane is at least partially, preferably completely made of toughened glass.

A particularly impact-resistant fixing of the window pane which seals the viewing window on the display of the electronic device can be achieved with the aid of a transparent adhesive layer by means of which the electronic device with its display is fixed on the window pane. In this case, in particular an acrylate, in particular a photo-initiated curing acrylate can be used as adhesive.

A particularly high fracture strength of the casing can be achieved if a metal is selected as material for the casing. Improved damping properties are obtained on the other hand if not metal but a plastic, in particular a thermoplastic such as, for example, polyamide is used.

Further important features and advantages of the invention are obtained from the subclaims, from the drawings and from the appurtenant description of the figures by reference to the drawings.

It is understood that the features specified hereinbefore and to be explained hereinafter can be used not only in the respectively given combination but also in other combinations or alone without departing from the framework of the present invention.

BRIEF DESCRIPTION OF THE DRAWINGS

Preferred exemplary embodiments of the invention are shown in the drawings and are explained in detail in the following description.

FIG. 1 illustrates a schematic longitudinal section of an exemplary device arrangement.

DETAILED DESCRIPTION

The single FIG. 1 shows in coarse schematic view and in a longitudinal section an example of a device arrangement 1 according to the invention. The arrangement 1 comprises a casing 2 made of a metal which surrounds a casing interior 3. In one variant the casing 2 can also be made of a preferably thermoplastic material. In the casing 2, a viewing window 4 is provided, which in turn is sealed by a transparent window pane 5 made of toughened glass. Located in the casing interior 3 is an electronic device 6 in the form of a tablet computer 7 with a touch-sensitive display 8. The touch-sensitive display 8 and therefore the entire electronic device 6 is fixed in a fixed position on the window pane 5 with the aid of a transparent adhesive layer 9. An acrylate, in particular a photo-initiated curing acrylate is used as adhesive.

The device arrangement 1 further comprises a suspension/damping device 10 by means of which the window pane 5 and also the electronic device 6 can be supported on the casing 2. In the case of a mechanical impact acting from outside on the window pane 5—indicated schematically in FIG. 1 by an arrow designated by F—the energy transmitted during the impact is absorbed at least partially by the suspension/damping device 10, where the window pane 5 including the electronic device 6 fastened thereon is deflected temporarily from its rest position. In this way, the impact-induced mechanical loading of the window pane 5 is reduced appreciably. This results in an improved fracture resistance of the entire device arrangement 1 in connection with mechanical impacts or blows acting on the window pane 5 or on the display 8. The deflection of the window pane 5 or the electronic device 6 from the rest position is reproduced in the example of FIG. 1 by the arrows X.

Preferably, the window pane 5 is mounted flexibly at the casing 2, in particular at a casing wall 13 bordering the viewing window, by means of the suspension/damping device 10. Thus, the window pane 5 may temporarily become detached from the casing 2 in case of a bow or impact, before being pressed anew against the casing 2 by means of the suspension/damping device 10. Thus, a bursting of the window pane 5 caused by blow or impact may be prevented. An especially break resistance of the window pane 5 is achieved, if it fits closely to the casing 2, in particular the casing wall 13, without forming a firmly bonded connection and without forming a adhesive joint with the casing 2. Particularly preferable the suspension/damping device 10 may be pretensioned against the casing 2, in particular the casing wall 13.

As can be seen in FIG. 1, the suspension/damping device 10 comprises a plurality of suspension/damping elements 11 made of a resilient material. For example, an elastomer, in particular a foam may be used as material. In the casing interior 3 of the example scenario, four first suspension/damping elements 11a are provided of which only two elements 11a are shown in the longitudinal section of FIG. 1. The suspension/damping elements 11a can be arranged in relation to a plan view from inside onto the window pane 5 in the area of the four corners thereof (not shown). The window pane 5 is supported resiliently on the casing 2 by means of the first suspension/damping elements 11a.

In the casing interior 3, four second suspension/damping elements 11b are furthermore additionally provided of which only two elements are shown in the longitudinal section of FIG. 1. The electronic device 6 is supported resiliently on the casing 2 by means of the second suspension/damping elements 11a. The suspension/damping elements 11a can be arranged in relation to a plan view from inside onto a casing base 12 opposite the viewing window 4 in the area of the four corners thereof (not shown). In constructively simplified variants of the example, exclusively first suspension/ damping elements 11a or exclusively second suspension/damping elements 11b can be provided.

The casing 2 further possesses a casing wall 13 bordering the viewing window 4 against which the window pane 5 is pressed from inside with the aid of the first and second suspension/damping elements 11a, 11b of the suspension/damping device 10 so that it abuts in a mechanically stable manner against the casing wall 13 as long as no external impact forces F act on the window pane 5. In one variant not shown in FIG. 1, first suspension/damping elements 11a can also be supported on the casing wall 13.

It can be further deduced from FIG. 1 that a sealing element 14 in the form of a sealing ring is provided between the casing wall 13 and the window pane 5, which seals the casing interior 3 of the casing 2 against the surroundings U of the device arrangement 1. For this purpose the sealing element 14 is partially received in a receiving groove provided on the casing wall 13, which completely circumferentially borders the viewing window 4. In this way it is avoided that any explosive gas mixture present in the surroundings U can penetrate into the casing interior 3. The sealing element 14 is in this case dimensioned in such a manner that said sealing effect is also maintained when the movably mounted window pane 5 is deflected from its rest position as a result of the externally acting impact force F. In a preferred variation, the suspension/damping device 10 can at least partially, preferably completely, circumferentially border the viewing window 4. Alternatively or additionally, the suspension/damping device 10 can at least partially, preferably completely, circumferentially border the viewing window 4.

Furthermore an additional suspension/damping device 15 can be provided outside on the casing 2, which only depicted schematically in FIG. 1. Such an additional suspension/damping device 15 may be implemented in the form of a jacket 16 having resilient properties ties which has a through opening 17 in the region of the window pane 5 in order not to block the view of the user of the electronic device 6 of the display 8. A plurality of options present themselves to the person skilled in the art with regard to the implementation of the suspension/damping device; it may be considered to provide such a jacket only in a web-like manner in the region of the casing edges or corners.

In a further variant not shown in FIG. 1 the additional suspension/damping device 15 can possibly comprise one or more suspension/damping elements which is/are fastened only locally on a casing outer side of the casing 2, for example, on a rear pane of the casing 2 facing away from the window pane.

An elastomer, for example, the said styrene block copolymer (SEBS) or an ethylene propylene diene rubber (EPDM) can also be considered as material for the additional suspension/damping device 15. The use of foam is also feasible.

The invention claimed is:

1. A device arrangement, comprising:
   a casing surrounding a casing interior, the casing including a viewing window which is sealed by a transparent window pane,
   an electronic device disposed in the casing interior and having a display, the display secured in a fixed position on the window pane, and
   a suspension/damping device disposed within the casing interior and including a spring element supporting at least one of the window pane and the electronic device on the casing by biasing the window pane against a first side of the casting interior while providing space for movement relative to a second side of the casting interior, wherein the biasing includes the window pane being pretensioned against a casing wall via the suspension/damping device.

2. The device arrangement according to claim 1, wherein the casing includes the casing wall bordering the viewing window, and
   wherein the biasing further includes the electronic device being pretensioned against the casing wall via the suspension/damping device.

3. The device arrangement according to claim 1, wherein the suspension/damping device includes at least one suspension/damping element composed of a resilient material.

4. The device arrangement according to claim 1, wherein the window pane is mounted flexibly to withstand transient loads at the casing via the suspension/damping device by the window pane temporarily detaching from the casing in response to impact.

5. The device arrangement according to claim 4, wherein the window pane is fitted to the casing without forming at least one of a bonded connection and an adhesive joint with the casing.

6. The device arrangement according to claim 1, wherein the window pane is fitted to the casing without forming at least one of a bonded connection and an adhesive joint with the casing.

7. The device arrangement according to claim 1, wherein the suspension/damping device includes at least one of:
   at least one first suspension/damping element supporting the window pane resiliently on the casing, and
   at least one second suspension/damping element supporting the electronic device resiliently on the casing.

8. The device arrangement according to claim 1, further comprising another suspension/damping device at least partially extending around an exterior perimeter of the casing.

9. The device arrangement according to claim 1, further comprising a sealing element arranged between the casing wall and the window pane, the sealing element sealing the casing interior of the casing from a surrounding environment.

10. The device arrangement according to claim 9, wherein at least one of the sealing element circumferentially borders the viewing window and the suspension/damping device at least partially circumferentially borders the viewing window.

11. The device arrangement according to claim 1, wherein the window pane is composed of at least one of a toughened glass and a transparent ceramic.

12. The device arrangement according to claim 1, wherein the window pane is secured to the display of the electronic device via an adhesive layer, the adhesive layer including a transparent adhesive.

13. The device arrangement according to claim 1, wherein the casing is composed of at least one of a metal and a plastic.

14. The device arrangement according to claim 1, further comprising a second suspension/damping device extending at least partially around an exterior perimeter of the casing, the second suspension/damping device including a resilient jacket defining a through opening in a region of the window pane.

15. The device arrangement according to claim 1, wherein the suspension/damping device includes at least one suspension/damping element composed of a resilient material, wherein the at least one suspension/damping element is arranged between the casing and at least one of the window pane and the electronic device.

16. A device arrangement, comprising:
- a casing including a casing wall at least partially enclosing a casing interior, wherein the casing wall defines a viewing window;
- a window pane composed of a transparent material secured at the viewing window to seal the casing interior from a surrounding environment;
- an electronic device disposed in the casing interior, the electronic device including a display secured in a fixed position at the window pane; and
- a suspension/damping device disposed in the casting interior and including a spring element supporting at least one of the window pane and the electronic device on the casing, the suspension/damping device including at least one suspension/damping element composed of a resilient material, wherein the at least one suspension/damping element is arranged between the casing wall and at least one of the window pane and the electronic device;

wherein the window pane is pretensioned against the casing wall via the at least one suspension/damping element.

17. The device arrangement according to claim 16, wherein the biasing further includes the electronic device being pretensioned against the casing wall via the suspension/damping device.

18. The device arrangement according to claim 17, wherein the suspension/damping device includes at least one suspension/damping element composed of a resilient material.

19. The device arrangement according to claim 17, wherein the window pane is fitted to the casing wall without forming at least one of a bonded connection and an adhesive joint with the casing wall.

20. The device arrangement according to claim 16, wherein the window pane is flexibly mounted at the casing via the suspension/damping device to withstand transient loads by the window pane temporarily detaching from the casing in response to impact.

* * * * *